(12) United States Patent
Hayami

(10) Patent No.: US 6,765,511 B2
(45) Date of Patent: Jul. 20, 2004

(54) METHOD AND APPARATUS FOR ENCODING DIGITAL DATA

(75) Inventor: Atsushi Hayami, Yokohama (JP)

(73) Assignee: Victor Company of Japan, Ltd., Yokohama (JP)

(*) Notice: Subject to any disclaimer, the term of this patent is extended or adjusted under 35 U.S.C. 154(b) by 0 days.

(21) Appl. No.: 10/408,449

(22) Filed: Apr. 8, 2003

(65) Prior Publication Data

US 2004/0001012 A1 Jan. 1, 2004

(30) Foreign Application Priority Data

Jun. 27, 2002 (JP) ........................................ 2002-187484

(51) Int. Cl.[7] .............................................. H03M 7/00
(52) U.S. Cl. ............................................ 341/59; 341/58
(58) Field of Search .............................. 341/59, 58, 65, 341/67, 50

(56) References Cited

U.S. PATENT DOCUMENTS 5,570,248 A * 10/1996 Ido et al. .................. 360/77.14
5,870,040 A * 2/1999 Ando ........................ 341/106
6,496,541 B1 * 12/2002 Kahlman et al. ........... 375/253
6,577,255 B2 * 6/2003 Hayami et al. ............. 341/59
6,653,952 B2 * 11/2003 Hayami et al. ............. 341/59

FOREIGN PATENT DOCUMENTS

JP     11-346154     12/1999     ........... G11B/20/10

* cited by examiner

*Primary Examiner*—Peguy JeanPierre
(74) *Attorney, Agent, or Firm*—Louis Woo

(57) ABSTRACT

An input bit stream is encoded into a stream of output code words according to variable-length encoding rules using a variable constraint length. The output-code-word stream observes prescribed run length limiting rules RLL(d, k). Every m-bit piece of the input bit stream is encoded into an n-bit output code word by referring to predetermined M encoding tables following the variable-length encoding rules. CDS (code word digital sum) values are calculated which correspond to respective n-bit output code words. DSV (digital sum variation) control bits are generated in response to the calculated CDS values. The generated DSV control bits are periodically inserted into the input bit stream at intervals each corresponding to a prescribed number of successive bits. The input bit stream is subjected to variable-length encoding while DSV control is implemented in response to the inserted DSV control bits.

4 Claims, 5 Drawing Sheets

```
INPUT DATA      OUTPUT CODE WORD
   11              *0*
   10              001
   01              010
   0011            010 100
   0010            010 000
   0001            000 100
   000011          000 100 100
   000010          000 100 000
   000001          010 100 100
   000000          010 100 000
  *110111          001 000 000  (next 010)
   00001000        000 100 100 100
   00000000        010 100 100 100
   if xx1 then *0*=000
      xx0 then *0*=101
```

| ID=0 Sk=0 | | | | | ID=1 Sk=1 | | | | | ID=2 Sk=2 | | | |
|---|---|---|---|---|---|---|---|---|---|---|---|---|---|
| Dk | Ck | | CDS | Sk+1 | Dk | Ck | | CDS | Sk+1 | Dk | Ck | | CDS | Sk+1 |
| 01XXXXXXXX | 2 | 010 | -1 | 0 | 01XXXXXXXX | 2 | 010 | -1 | 0 | 01XXXXXXXX | 4 | 100 | -3 | 0 |
| 10XXXXXXXX | 1 | 001 | 1 | 1 | 10XXXXXXXX | 1 | 001 | 1 | 1 | 11XXXXXXXX | 4 | 100 | -3 | 0 |
| 11011101XX | 1 | 001 | 1 | 5 | 11011101XX | 1 | 001 | 1 | 5 | 10XXXXXXXX | 0 | 000 | 3 | 0 |
| 110111001XX | 1 | 001 | 1 | 5 | 110111001XX | 1 | 001 | 1 | 5 | 001XXXXXXX | 4 | 100 | -3 | 3 |
| 11011100000 | 1 | 001 | 1 | 5 | 11011100000 | 1 | 001 | 1 | 5 | 000XXXXXXX | 4 | 100 | -3 | 3 |
| 11XXXXXXXX | 5 | 101 | -1 | 1 | 11XXXXXXXX | 0 | 000 | 3 | 0 | | | | | |
| 001XXXXXXX | 2 | 010 | -1 | 2 | 001XXXXXXX | 2 | 010 | -1 | 2 | | | | | |
| 0001XXXXXX | 0 | 000 | 3 | 2 | 0001XXXXXX | 0 | 000 | 3 | 2 | | | | | |
| 00000XXXXX | 2 | 010 | -1 | 2 | 00000XXXXX | 2 | 010 | -1 | 2 | | | | | |
| 00001XXXXX | 0 | 000 | 3 | 2 | 00001XXXXX | 0 | 000 | 3 | 2 | | | | | |

| ID=3 Sk=3 | | | | | ID=4 Sk=4 | | | | | ID=5 Sk=5 | | | |
|---|---|---|---|---|---|---|---|---|---|---|---|---|---|
| Dk | Ck | | CDS | Sk+1 | Dk | Ck | | CDS | Sk+1 | Dk | Ck | | CDS | Sk+1 |
| 0000XXXXXX | 4 | 100 | -3 | 4 | 00XXXXXXXX | 4 | 100 | -3 | 0 | 01XXXXXXXX | 0 | 000 | 3 | 5 |
| 00XXXXXXXX | 0 | 000 | 3 | 0 | | | | | | 11XXXXXXXX | 0 | 000 | 3 | 0 |
| 01XXXXXXXX | 4 | 100 | -3 | 4 | | | | | | | | | | |
| 1000XXXXXX | 4 | 100 | -3 | 0 | | | | | | | | | | |
| 10XXXXXXXX | 0 | 000 | 3 | 0 | | | | | | | | | | |
| 11XXXXXXXX | 4 | 100 | -3 | 0 | | | | | | | | | | |

FIG. 5

INPUT DATA

| FRAME 0 | FRAME 1 | FRAME 2 | FRAME 3 |
|---|---|---|---|
| CALCULATION OF DSV CONTROL BITS FOR FRAME 0 | CALCULATION OF DSV CONTROL BITS FOR FRAME 1 | CALCULATION OF DSV CONTROL BITS FOR FRAME 2 | CALCULATION OF DSV CONTROL BITS FOR FRAME 3 |
|  | ENCODING OF FRAME 0 | ENCODING OF FRAME 1 | ENCODING OF FRAME 2 |

→ TIME

FIG. 6

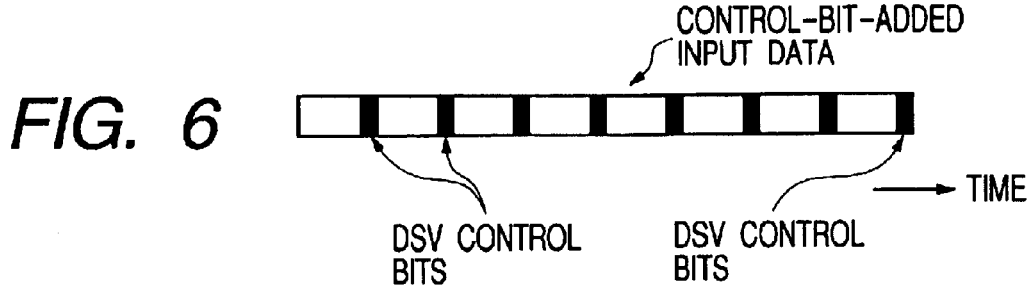

CONTROL-BIT-ADDED INPUT DATA

DSV CONTROL BITS    DSV CONTROL BITS

→ TIME

FIG. 7

INPUT BIT : 11x1110011100011111000    x=0

| 2 HIGHER BITS | 11 | 01 | 11 | 00 | 11 | 10 |
|---|---|---|---|---|---|---|
| CDS | 1 | 3 | 3 | -1 | -3 | 1 |
| POLARITY | 0 | 1 | 1 | 0 | 0 | 0 |
| $S_{k+1}$ | 5 | 5 | 0 | 2 | 0 | 1 |
| $C_k$ | 001 | 000 | 000 | 010 | 100 | 001 |
| DSV | 1 | -2 | -5 | -4 | -7 | -8 |

FIG. 8

INPUT BIT : 11x1110011100011111000    x=1

| 2 HIGHER BITS | 11 | 11 | 11 | 00 | 11 | 10 |
|---|---|---|---|---|---|---|
| CDS | -1 | 3 | -1 | -1 | -3 | 1 |
| POLARITY | 1 | 1 | 1 | 0 | 0 | 0 |
| $S_{k+1}$ | 1 | 0 | 1 | 2 | 0 | 1 |
| $C_k$ | 101 | 000 | 101 | 010 | 100 | 001 |
| DSV | -1 | 2 | 1 | 0 | 3 | 4 |

METHOD AND APPARATUS FOR ENCODING DIGITAL DATA

BACKGROUND OF THE INVENTION

1. Field of the Invention

This invention relates to a method of encoding digital data. In addition, this invention relates to an apparatus for encoding digital data. Furthermore, this invention relates to a recording medium, a transmission medium, and a computer-related program.

2. Description of the Related Art

Some encoding (modulation) systems used for digital signals recorded on recording mediums are of an RLL(d, k) type, where "RLL(d, k)" means run length limiting rules such that "d" to "k" successive bits of "0" should be between bits of "1" in an encoding-resultant bit stream.

General systems for encoding first digital signals into second digital signals which follow RLL(d, k) include a block encoding system and a variable-length encoding system. A typical example of the block encoding system is an EFMPlus (eight-to-sixteen modulation) system for digital versatile discs (DVDs). A typical example of the variable-length encoding system is one used for magnetic recording which conforms to RLL (1, 7).

The EFMPlus system encodes every 8-bit block of digital data into a 16-bit code word by referring to an encoding table, and serially connects the resultant code words to get a code-word sequence in the form of a bit stream which satisfies RLL(d, k). Thus, the EFMPlus system implements conversion from 8 bits to 16 bits.

Basically, the variable-length encoding system for magnetic recording converts a 2-bit input data piece into a 3-bit output code word. Sometimes, the variable-length encoding system converts a 4-bit or 6-bit input data piece into a 6-bit or 9-bit output code word. Thus, the data conversion by the variable-length encoding system relates to an encoding constraint length changeable among three different values. The variable-length encoding system serially connects the resultant output code words to get an output code-word sequence in the form of a bit stream. One is selected among the conversion from 2 bits to 3 bits, the conversion from 4 bits to 6 bits, and the conversion from 6 bits to 9 bits in response to a bit pattern of the input data so that the output code-word sequence will follow RLL(d, k).

Japanese patent application publication number 11-346154/1999 discloses an RLL(1, 7) modulation apparatus which includes an inserting section for adding DSV (digital sum value or digital sum variation) control bits to an input data sequence. The inserting section outputs the DSV-control-bit-added data to a modulator. The modulator handles the output data from the inserting section as data having a basic data length of 2 bits. According to conversion tables, the modulator converts the output data from the inserting section into data of a variable length code having a basic data length of 3 bits. The modulator outputs the variable-length-code data to an NRZI converter. The conversion tables have a replacement code for restricting succession of a minimum run to a prescribed number of times or less, and a replacement code for observing the run length limiting rules. The conversion tables further have a conversion rule such that the remainder in the division of the number of bits of "1" in each input element by 2 and the remainder in the division of the number of bits of "1" in a corresponding output element by 2 are equal to each other as 1 or 0. Thus, each input element and a corresponding output element are equal in polarity ("odd-even" in the number of bits of "1" in an element). The modulation apparatus in Japanese application 11-346154 implements DSV control while forcing the modulation-resultant (conversion-resultant) bit stream to follow RLL(1, 7).

In Japanese application 11-346154, the modulator encodes a 2-bit, 4-bit, 6-bit, or 8-bit input data piece into a 3-bit, 6-bit, 9-bit, or 12-bit output code word by referring to the conversion tables. The encoding is of the variable length type. The conversion tables are based on the following assignment of input data pieces to output code words.

| input data piece | output data piece |
|---|---|
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| "110111 | 001 000 000 (next 010) |
| 00001000 | 000 100 100 100 |
| 00000000 | 010 100 100 100 |
| if xx1 then *0* = 000 | |
| if xx0 then *0* = 101 | |

The above-indicated 2-bit input data pieces correspond to a constraint length of "1". The above-indicated 4-bit input data pieces correspond to a constraint length of "2". The above-indicated 6-bit input data pieces correspond to a constraint length of "3". The above-indicated 8-bit input data pieces correspond to a constraint length of "4".

The modulation apparatus in Japanese application 11-346154 includes a portion for deciding which of constraint lengths a current input data piece corresponds to, and also a portion for minimum-run detection control. Therefore, the modulation apparatus is complicated in structure.

SUMMARY OF THE INVENTION

It is a first object of this invention to provide a relatively simple method of encoding digital data.

It is a second object of this invention to provide a relatively simple apparatus for encoding digital data.

It is a third object of this invention to provide an improved recording medium.

It is a fourth object of this invention to provide an improved transmission medium.

It is a fifth object of this invention to provide an improved computer-related program.

A first aspect of this invention provides a method of encoding an input bit stream into a stream of output code words according to variable-length encoding rules using a variable constraint length. A maximum value N of the constraint length is equal to or greater than 2, and the output-code-word stream observes prescribed run length limiting rules RLL(d, k), where "d" and "k" denote a predetermined minimum run length and a predetermined maximum run length respectively. The method comprises the steps of encoding every m-bit piece of the input bit stream into an n-bit output code word by referring to predetermined M encoding tables following the variable-length encoding rules, "m" and "n" denoting predetermined natural numbers respectively, M denoting a predetermined natural number equal to or greater than 2; generating CDS (code word digital sum) values corresponding to respective n-bit output code words generated by the encoding step; generating DSV (digital sum variation) control bits in response to the generated CDS values; periodically inserting the generated DSV control bits into the input bit stream at intervals each corresponding to a prescribed number of successive bits; and subjecting the input bit stream to variable-length encoding while implementing DSV control responsive to the inserted DSV control bits.

A second aspect of this invention is based on the first aspect thereof, and provides a method further comprising the steps of calculating DSV values equal to accumulations of the CDS values; deciding the DSV control bits in response to the calculated DSV values; and subjecting the input bit stream to the variable-length encoding in accordance with the M encoding tables.

A third aspect of this invention is based on the first aspect thereof, and provides a method wherein the numbers "d" and "k" are equal to 1 and 7, respectively.

A fourth aspect of this invention provides an apparatus for encoding an input bit stream into a stream of output code words according to variable-length encoding rules using a variable constraint length. A maximum value N of the constraint length is equal to or greater than 2, and the output-code-word stream observes prescribed run length limiting rules RLL(d, k), where "d" and "k" denote a predetermined minimum run length and a predetermined maximum run length respectively. The apparatus comprises first means for encoding every m-bit piece of the input bit stream into an n-bit output code word by referring to predetermined M encoding tables following the variable-length encoding rules, "m" and "n" denoting predetermined natural numbers respectively, M denoting a predetermined natural number equal to or greater than 2; second means for generating CDS (code word digital sum) values corresponding to respective n-bit output code words generated by the first means; third means for generating DSV (digital sum variation) control bits in response to the CDS values generated by the second means; fourth means for periodically inserting the DSV control bits generated by the third means into the input bit stream at intervals each corresponding to a prescribed number of successive bits; and fifth means for subjecting the input bit stream to variable-length encoding while implementing DSV control responsive to the inserted DSV control bits.

A fifth aspect of this invention is based on the fourth aspect thereof, and provides an apparatus further comprising means for calculating DSV values equal to accumulations of the CDS values; means for deciding the DSV control bits in response to the calculated DSV values; and means for subjecting the input bit stream to the variable-length encoding in accordance with the M encoding tables.

A sixth aspect of this invention is based on the fourth aspect thereof, and provides an apparatus wherein the numbers "d" and "k" are equal to 1 and 7, respectively.

A seventh aspect of this invention provides a recording medium storing an output-code-word stream generated from an input bit stream by the method in the first aspect of this invention.

An eighth aspect of this invention provides a transmission medium for transmission of an output-code-word stream generated from an input bit stream by the method in the first aspect of this invention.

A ninth aspect of this invention provides a computer program for enabling a computer to implement the method in the first aspect of this invention.

A tenth aspect of this invention provides an apparatus for encoding an input bit stream into a stream of output code words according to variable-length encoding rules using a variable constraint length. A maximum value N of the constraint length is equal to or greater than 2, and the output-code-word stream observes prescribed run length limiting rules RLL(d, k), where "d" and "k" denote a predetermined minimum run length and a predetermined maximum run length respectively. The apparatus comprises first means for periodically inserting a first candidate DSV (digital sum variation) control bit being "0" into an original input bit stream to get first control-bit-added input data; second means for periodically inserting a second candidate DSV control bit being "1" into the original input bit stream to get second control-bit-added input data; third means for encoding every m-bit piece of the first control-bit-added input data into a first n-bit output signal by referring to a plurality of encoding tables following the variable-length encoding rules, "m" and "n" denoting predetermined natural numbers respectively; fourth means for encoding every m-bit piece of the second control-bit-added input data into a second n-bit output signal by referring to the encoding tables; fifth means for generating first CDS (code word digital sum) values corresponding to respective first n-bit output signals generated by the third means; sixth means for generating second CDS values corresponding to respective second n-bit output signals generated by the fourth means; seventh means for periodically generating a first DSV value in response to the first CDS values generated by the fifth means, the first DSV value corresponding to the first candidate DSV control bit; eighth means for periodically generating a second DSV value in response to the second CDS values generated by the sixth means, the second DSV value corresponding to the second candidate DSV control bit; ninth means for comparing the first and second DSV values generated by the seventh and eighth means with each other, and deciding which of the first and second DSV values is smaller in absolute value to get a smaller-absolute DSV value; tenth means for selecting one from the first and second candidate DSV control bits as a final DSV control bit which corresponds to the smaller-absolute DSV value; eleventh means for inserting the final DSV control bit into the original input bit stream to get final control-bit-added input data; and twelfth means for encoding every m-bit piece of the final control-bit-added input data into a final n-bit output signal by referring to the encoding tables; and thirteenth means for serially connecting final n-bit output signals generated by the twelfth means to get a stream of output code words.

BRIEF DESCRIPTION OF THE DRAWINGS

FIG. 4 is a diagram of the contents of encoding tables in FIGS. 1 and 2.

FIG. 5 is a time-domain diagram of the relation among sync frames, the calculation of DSV control bits for the sync frames, and the encoding of input data in the sync frames.

FIG. 6 is a time-domain diagram of control-bit-added input data.

FIG. 7 is a diagram of a history of 2 higher bits of an 11-bit portion sampled from an input-data bit sequence of "110111001110001111000", a CDS value, a polarity signal, a next-table selection number Sk+1, an output code word Ck, and a DSV value.

FIG. 8 is a diagram of a history of 2 higher bits of an 11-bit portion sampled from an input-data bit sequence of "111111001110001111000", a CDS value, a polarity signal, a next-table selection number Sk+1, an output code word Ck, and a DSV value.

DETAILED DESCRIPTION OF THE INVENTION

First Embodiment

Figure 1:
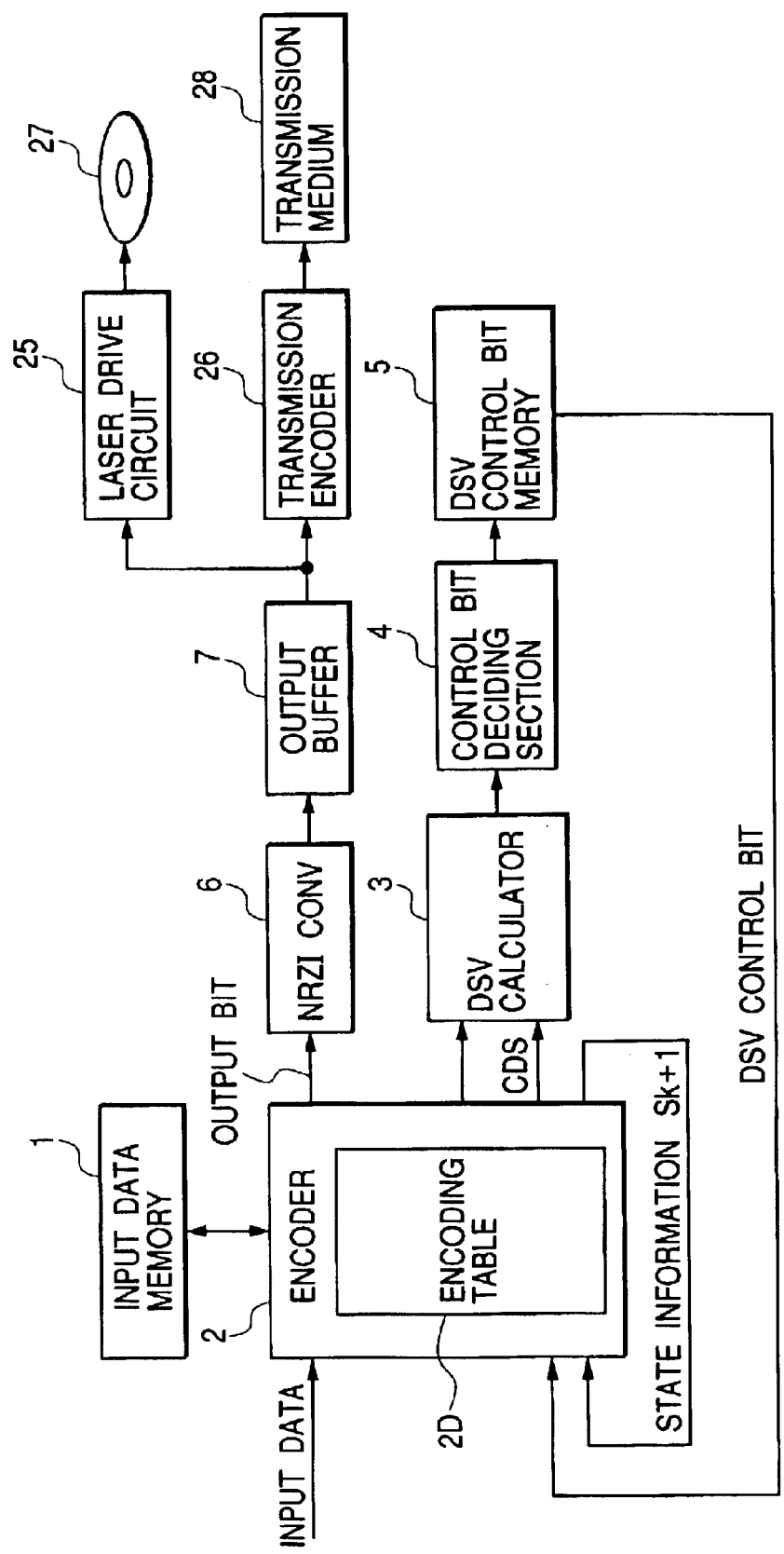
FIG. 1 is a block diagram of an encoding apparatus according to a first embodiment of this invention.

FIG. 1 shows an encoding apparatus according to a first embodiment of this invention. As shown in FIG. 1, the encoding apparatus includes a memory 1 for input data, an encoder 2, a DSV calculator 3, a control-bit deciding section 4, a memory for DSV control bits, an NRZI (non-return-to-zero invert) converter 6, and an output buffer 7. The memory 1 is connected with the encoder 2. The encoder 2, the NRZI converter 6, and the output buffer 7 are successively connected in that order. The encoder 2, the DSV calculator 3, the control-bit deciding section 4, and the memory 5 are successively connected in a closed loop. The output buffer 7 is followed by a laser drive circuit 25 and a transmission encoder 26.

The encoder 2 may be formed by a digital signal processor, a CPU, or a similar device including a combination of an input/output port, a processing section, a ROM, and a RAM. In this case, the encoder 2 operates in accordance with a control program (a computer-related program) stored in the ROM or the RAM. The control program is designed to enable the encoder 2 to implement operation steps mentioned hereafter.

The encoder 2 includes encoding tables 2D. The encoder 2 receives input data (an input digital signal) in the form of, for example, a bit stream. The input data are generated as follows. Video information, audio information, or audio-visual information to be recorded or transmitted is converted into a first bit stream by a binarizing device (not shown). The fist bit stream is formatted into a sequence of sync frames by a formatting section (not shown). The sync-frame sequence constitutes the input data being a second bit stream. The formatting of the first bit stream into the sync-frame sequence includes a step of adding an error correction code, a step of adding frame sync signals, and a step of providing the first bit stream with a sector structure.

The encoder 2 feeds the received input data into the memory 1. The memory 1 stores the input data on a frame-by-frame basis, where "frame" means a sync frame. For every sync frame relating to the received input data, the encoder 2 reads, from the memory 1, the input data corresponding to the sync frame immediately preceding the present sync frame. In addition, the encoder 2 is fed with DSV control bits (final DSV control bits) corresponding to the sync frame immediately preceding the present sync frame. The encoder 2 periodically inserts the DSV control bits into the read input data at equal intervals of a prescribed number of successive bits to get final control-bit-added input data. The device 2 encodes the final control-bit-added input data by referring to the encoding tables 2D. The encoding by the encoder 2 conforms to prescribed run length limiting rules RLL(d, k) which require "d" to "k" successive bits of "0" to be between bits of "1" in an encoding-resultant bit stream, where "d" and "k" denote a minimum run and a maximum run respectively. An example of RLL(d, k) is RLL(1, 7). Specifically, according to the encoding tables 2D, the encoder 2 converts the 2 higher bits (the highest bit and the second highest bit) in every 11-bit piece of the final control-bit-added input data into a corresponding 3-bit signal forming at least portion of an output code word. Thereby, the encoder 2 changes the final control-bit-added input data into a final sequence of output code words. The final output-code-word sequence is also referred to as encoding-resultant data.

The NRZI converter 6 receives the encoding-resultant data from the encoder 2. The NRZI converter 6 subjects the encoding-resultant data to NRZI modulation to generate modulation-resultant data of an NRZI code. The modulation-resultant data are sent from the NRZI converter 6 to at least one of the laser drive circuit 25 and the transmission encoder 26 via the output buffer 7. The laser drive circuit 15 records the modulation-resultant data on an optical disc 27 via an optical head. The optical disc 27 is an example of a recording medium. The laser drive circuit 25 may be replaced with a magnetic-head drive circuit. In this case, the magnetic-head drive circuit records the modulation-resultant data on a magnetic recording medium via a magnetic head. The transmission encoder 26 encodes the modulation-resultant data into data of a code suited for transmission. The transmission encoder 26 outputs the transmission-code data to a transmission medium 28 formed by, for example, a communication network. The transmission-code data propagate along the transmission medium 28.

The closed loop of the encoder 2, the DSV calculator 3, the control-bit deciding section 4, and the memory 5 functions to generate and store final DSV control bits. Specifically, the encoder 2 periodically inserts a bit of "0" (a first candidate DSV control bit) into the received input data to get a first control-bit-added input data. Also, the encoder 2 periodically inserts a bit of "1" (a second candidate DSV control bit) into the received input data to get a second control-bit-added input data. According to the encoding tables 2D, the encoder 2 converts the 2 higher bits (the highest bit and the second highest bit) in every 11-bit piece of the first control-bit-added input data into a first corresponding 3-bit signal forming at least portion of an output code word. Thereby, the encoder 2 changes the first control-bit-added input data into a first sequence of output code words. At the same time, the encoder 2 generates a first code word digital sum (CDS) value relating to the first 3-bit signal, and also a first polarity signal representing a bit polarity of corresponding data resulting from the NRZI modulation by the NRZI converter 6. The bit polarity can change between a positive (+1) and a negative (−1). The encoder 2 notifies the DSV calculator 3 of the first CDS value. The encoder 2 outputs the first polarity signal to the DSV calculator 3. According to the encoding tables 2D, the encoder 2 converts the 2 higher bits (the highest bit and the second highest bit) in every 11-bit piece of the second control-bit-added input data into a second corresponding 3-bit signal forming at least portion of an output code word. Thereby, the encoder 2 changes the second control-bit-added input data into a second sequence of output code words. At the same time, the encoder 2 generates a second code word digital sum (CDS) value relating to the second 3-bit signal, and also a second polarity signal representing a bit polarity of corresponding data resulting from the NRZI modulation by the NRZI converter 6. The encoder 2 notifies the DSV calculator 3 of the second CDS value. The encoder 2 outputs the second polarity signal to the DSV calculator 3.

The DSV calculator 3 periodically computes a first DSV (digital sum variation) value equal to the integration, the accumulation, or the summation of the first CDS values from the start of a related sync frame. The DSV calculator 3 uses the first polarity signal in periodical computation of the first DSV value. The first DSV value corresponds to the first control-bit-added input data or the first candidate DSV control bit. The DSV calculator 3 includes a DSV memory for storing a signal representative of the computed first DSV value. The DSV calculator 3 notifies the control-bit deciding section 4 of the computed first DSV value. Also, the DSV calculator 3 periodically computes a second DSV (digital sum variation) value equal to the integration, accumulation, or the summation of the second CDS values from the start of a related sync frame. The DSV calculator 3 uses the second polarity signal in periodical computation of the second DSV value. The second DSV value corresponds to the second control-bit-added input data or the second candidate DSV control bit. The DSV calculator 3 includes a DSV memory for storing a signal representative of the computed second DSV value. The DSV calculator 3 notifies the control-bit deciding section 4 of the computed second DSV value.

The control-bit deciding section 4 senses ones among the first DSV values which correspond to the DSV-control-bit insertion points in the first control-bit-added input data respectively. The first DSV values relate to the first candidate DSV control bits. Also, the control-bit deciding section 4 senses ones among the second DSV values which correspond to the DSV-control-bit insertion points in the second control-bit-added input data respectively. The second DSV values relate to the second candidate DSV control bits. For every DSV-control-bit insertion point, the control-bit deciding section 4 compares the first and second corresponding DSV values with each other to decide which of the two is smaller in absolute value. The control-bit deciding section 4 selects one from the first and second candidate DSV control bits which corresponds to the smaller-absolute DSV value. The control-bit deciding section 4 decides that a final DSV control bit for the DSV-control-bit insertion point immediately preceding the present DSV-control-bit insertion point is equal to the selected one. Preferably, the control-bit deciding section 4 accesses the DSV memories in the DSV calculator 3 and updates the DSV value with the larger absolute value to the DSV value with the smaller absolute value therein. These operation steps are iterated so that the control-bit deciding section 4 sequentially decides and generates a plurality of final DSV control bits.

The final DSV control bits are sequentially stored into the memory 5 from the control-bit deciding section 4. The final DSV control bits are sequentially transferred from the memory 5 to the encoder 2. As previously mentioned, the encoder 2 inserts the final DSV control bits into the input data read out from the memory 1.

Figures 2, 3:
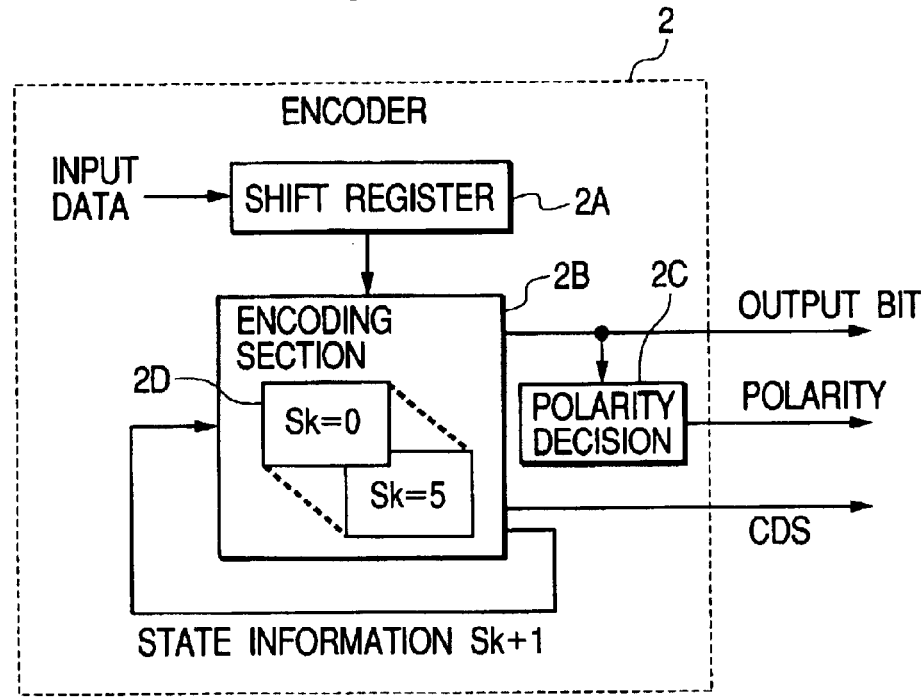
FIG. 2 is a block diagram of an encoder in FIG. 1.
FIG. 3 is a diagram of conversion rules deciding the relation between input data pieces and output code words.

As shown in FIG. 2, the encoder 2 includes a shift register 2A, an encoding section 2B, and a polarity deciding section 2C. The encoding section 2B contains the encoding tables 2D. One among the final control-bit-added input data in the form of a bit stream, the first control-bit-added input data in the form of a bit stream, and the second control-bit-added input data in the form of a bit stream are selectively stored into the shift register 2A, being transmitted through the cells of the shift register 2A. The shift register 2A is driven by a bit sync clock signal. Preferably, the shift register 2A periodically implements a shift by two bits. A given number of successive bits (for example, 11 successive bits) composing a current portion of the control-bit-added input data are held in the shift register 2A, and are sent therefrom to the encoding section 2B as a current input-data bit pattern.

The encoding tables 2D in the encoding section 2B are six encoding tables having identification (ID) numbers of "0", "1", "2", "3", "4", and "5" respectively. The encoding tables 2D register input signals (input bit patterns) Dk, and 3-bit output signals Ck assigned to the input signals Dk respectively. The encoding tables 2D contain array of cells at different addresses respectively. Each of the cells has a set of a registered input signal (a registered input bit pattern) Dk, a 3-bit output signal Ck assigned to the registered input signal Dk, a CDS value relating to the 3-bit output signal Ck, and a state-information number Sk+1 accompanying the 3-bit output signal Ck. The state-information number Sk+1 designates one among the six encoding tables 2D which will be used next. Specifically, the state-information number Sk+1 is equal to the ID number of the encoding table which will be used next. The state-information number Sk+1 is also referred to as the next-table selection number Sk+1. A next-table selection number accompanying a 3-bit output signal Ck−1 immediately preceding the current 3-bit output signal Ck is defined as a current-table selection number Sk used for generation of the current 3-bit output signal Ck in response to a current input signal. The current-table selection number Sk is also referred to as the state-information number Sk.

The encoding section 2B receives the input-data bit pattern from the shift register 2A. The encoding section 2B delays a signal representative of an adopted next-table selection number Sk+1 by a unit encoding time interval, thereby generating a signal representative of a current-table selection number Sk. The encoding section 2B feeds the signal of the current-table selection number Sk back thereto. The encoding section 2B selects one from the six encoding tables 2D which has an ID number equal to the current-table selection number (state-information number) Sk. The encoding section 2B compares or collates the input-data bit pattern with bit patterns represented by input signals Dk registered in the selected encoding table. Thereby, the encoding section 2B detects one among the bit patterns represented by the registered input signals Dk which agrees with the input-data bit pattern. The encoding section 2B reads, from the selected encoding table, a 3-bit output signal Ck assigned to the registered input signal Dk representing the bit pattern agreeing with the input-data bit pattern, a signal representative of a CDS value relating to the 3-bit output signal Ck, and also a signal representative of a next-table selection number (state-information number) Sk+1 accompanying the 3-bit output signal Ck. The encoding section 2B feeds the 3-bit output signal Ck to the NRZI converter 6 or the polarity deciding section 2C. Specifically, the encoding section 2B feeds the 3-bit output signal Ck to the NRZI converter 6 when the shift register 2A outputs the final control-bit-added input data to the encoding section 2B for the encoding into the final output-code-word sequence. On the other hand, the encoding section 2B feeds the 3-bit output signal Ck to the polarity deciding section 2C when the shift register 2A outputs the first or second control-bit-added input data to the encoding section 2B for the decision of final DSV control bits. The encoding section 2B feeds the signal representative of the CDS value to the CDS calculator 3 when the shift register 2A outputs the first or second control-bit-added input data to the encoding section 2B for the decision of final DSV control bits. As previously mentioned, the encoding section 2B delays the signal representative of the next-table selection number Sk+1, and feeds the delay-resultant signal back thereto as a signal representative of a current-table selection number Sk. In response to the 3-bit output signal Ck, the polarity deciding section 2C decides a bit polarity of data resulting from the NRZI modulation by the NRZI converter 6. The deciding section 2C feeds a signal representative of the decided bit polarity to the DSV calculator 3.

The contents of the encoding tables 2D are based on RLL(1, 7) conversion rules shown in FIG. 3 which are the same as a main portion of those disclosed in Japanese patent application publication number 11-346154/1999. The conversion rules correspond to variable length encoding. It should be noted that the conversion rules in FIG. 3 may be replaced by other conversion rules.

The conversion rules in FIG. 3 contain basic output code words assigned to input bit patterns (input data pieces) "11" to "000000", and replacement output code words assigned to input bit patterns "110111", "00001000", and "00000000". The basic output code words are indispensable to conversion. The replacement output code words enable conversion to be more efficient and effective although they are dispensable. The output code words in FIG. 3 are also referred to as the general output code words.

The conversion rules in FIG. 3 conform to RLL(1, 7) where a minimum run is "1" and a maximum run is "7". The basic output code words in the conversion rules include indefinite one "*0*" assigned to the input bit pattern "11". The indefinite output code word is set to either "000" or "101" so that a minimum run of "1" and a maximum run of "7" will be observed regardless of the states of immediately-preceding and immediately-following output code words. In the case where a current input data piece to be converted is "11" and the last bit of an immediately-preceding output code word is "1", an output code word of "000" is selected as current one to keep a minimum run of "1". On the other hand, in the case where a current input data piece to be converted is "11" and the last bit of an immediately-preceding output code word is "0", an output code word of "101" is selected as current one to keep a maximum run of "7".

According to the conversion rules in FIG. 3, in the case where a current input data piece to be converted is "110111", an immediately-following output code word is referred to. When the immediately-following output code word or an initial portion thereof is "010", an output code word of "001000000" is selected as current one. On the other hand, when the immediately-following output code word or an initial portion thereof differs from "010", the current input data piece "110111" is converted on a 2-bit by 2-bit basis ("11", "01", and "11") and is therefore changed into an output-code-word sequence of "*0*010*0*".

In the conversion rules of FIG. 3, each input data piece and a corresponding output code word are equal in polarity ("odd-even" in the number of bits of "1" in an element). The conversion rules can restrict a repetition of a minimum run of "1", that is, a repetition of a 2T portion in a record bit sequence, where "T" denotes the interval between bits composing the record bit sequence. In FIG. 3, the registered 2-bit input data pieces correspond to a constraint length of "1". The registered 4-bit input data pieces correspond to a constraint length of "2". The registered 6-bit input data pieces correspond to a constraint length of "3". The registered 8-bit input data pieces correspond to a constraint length of "4".

As shown in FIG. 4, the encoding tables 2D include ones having ID numbers of "0", "1", "2", "3", "4", and "5" respectively. The encoding tables 2D observe the conversion rules of FIG. 3. The encoding tables 2D register input data pieces (input bit patterns) Dk, and 3-bit output code words Ck assigned to the input data pieces Dk respectively. The registered input data pieces Dk contain indefinite bits "x". The encoding tables 2D have arrays of cells at different addresses respectively. Each of the cells has a set of a registered 11-bit input data piece (a registered input 11-bit pattern) Dk, a 3-bit output code word Ck assigned to the two former bits of the registered input data piece Dk, a CDS value relating to the output code word Ck, and a next-table selection number (state-information number) Sk+1 accompanying the output code word Ck. In FIG. 4, each input data piece (input bit pattern) Dk is expressed by the binary notation while each output code word Ck is expressed by both the decimal notion and the binary notation. Each next-table selection number Sk+1 designates one among the encoding tables which will be used next. Specifically, the next-table selection number Sk+1 is equal to the ID number of the encoding table which will be used next. The next-table selection numbers Sk+1 are designed so that a stream of output code words will follow RLL(1, 7). A next-table selection number accompanying the current output code word Ck is defined as a current-table selection number Sk used for generation of the current output code word Ck in response to a current input data piece.

With reference back to FIG. 2, the polarity deciding section 2C responds to every 3-bit output code word Ck fed from the encoding section 2B. Specifically, the polarity deciding section 2C counts bits of "1" in the output code word Ck, and decides whether the count-result number is odd or even. When the count-result number is odd, the polarity deciding section 2C outputs a signal of "0" to the DSV calculator 3 as a polarity signal. On the other hand, when the count-result number is even, the polarity deciding section 2C outputs a signal of "1" to the DSV calculator 3 as a polarity signal. Thus, the polarity deciding section 2C outputs a polarity signal of "0" in the case where the polarity of NRZI-modulation-resultant data will be inverted. The polarity deciding section 2C outputs a polarity signal of "1" in the case where the polarity of NRZI-modulation-resultant data will remain unchanged. Accordingly, a polarity signal of "0" denotes the presence of polarity inversion. On the other hand, a polarity signal of "1" denotes the absence of polarity inversion. The polarity signal outputted from the polarity deciding section 2C changes between the previously-mentioned first and second polarity signals corresponding to the first and second candidate DSV control bits respectively.

With reference to FIG. 5, there occurs a succession of sync frames "0", "1", "2", and "3" of the input data. The time intervals of sync frames correspond to a period at which a sync word (sync signal) is repetitively inserted into original data. Each sync frame is occupied by an input data portion to be converted into an output-code-word sequence having added DSV control bits of "0" and "1" which are spaced at equal intervals of a prescribed number of successive bits. For every sync frame, the input data are encoded into an output-code-word sequence in the way of decreasing the related DSV value.

During the application of the input data in the sync frame "0" to the encoder 2, the input data in the sync frame "0" is processed into the first and second control-bit-added input data by the encoder 2. Also, the input data in the sync frame "0" is stored into the memory 1. The combination of the encoding section 2B, the DSV calculator 3, and the control-bit deciding section 4 processes the first and second control-bit-added input data in the sync frame "0", and thereby sequentially generates final DSV control bits corresponding to the input data in the sync frame "0". The generated final DSV control bits are sequentially stored into the memory 5.

During the application of the input data in the sync frame "1" to the encoder 2, the encoder 2 sequentially reads, from the memory 5, the final DSV control bits corresponding to the input data in the sync frame "0". In addition, the encoder 2 reads the input data in the sync frame "0" from the memory 1. The encoder 2 sequentially inserts the final DSV control bits into the read input data at equal intervals of a prescribed number of successive bits to get final control-bit-added input data in the sync frame "0". The device 2 encodes the final control-bit-added input data in the sync frame "0" into a corresponding output-code-word sequence of the sync frame "0". The encoder 2 feeds the output-code-word sequence of the sync frame "0" to the NRZI converter 6. Furthermore, the input data in the sync frame "1" is processed into the first and second control-bit-added input data by the encoder 2. Also, the input data in the sync frame "1" is stored into the memory 1. The combination of the encoding section 2B, the DSV calculator 3, and the control-bit deciding section 4 processes the first and second control-bit-added input data in the sync frame "1", and thereby sequentially generates final DSV control bits corresponding to the input data in the sync frame "1". The generated final DSV control bits are sequentially stored into the memory 5.

During the application of the input data in the sync frame "2" to the encoder 2, the encoder 2 sequentially reads, from the memory 5, the final DSV control bits corresponding to the input data in the sync frame "1". In addition, the encoder 2 reads the input data in the sync frame "1" from the memory 1. The encoder 2 sequentially inserts the final DSV control bits into the read input data at equal intervals of the prescribed number of successive bits to get final control-bit-added input data in the sync frame "1". The device 2 encodes the final control-bit-added input data in the sync frame "1" into a corresponding output-code-word sequence of the sync frame"1". The encoder 2 feeds the output-code-word sequence of the sync frame "1" to the NRZI converter 6. Furthermore, the input data in the sync frame "2" is processed into the first and second control-bit-added input data by the encoder 2. Also, the input data in the sync frame "2" is stored into the memory 1. The combination of the encoding section 2B, the DSV calculator 3, and the control-bit deciding section 4 processes the first and second control-bit-added input data in the sync frame "2", and thereby sequentially generates final DSV control bits corresponding to the input data in the sync frame "2". The generated final DSV control bits are sequentially stored into the memory 5.

The above-mentioned operation steps are executed for each of the later sync frames. Thus, final DSV control bits are generated before being stored into the memory 5 for the input data in each of the later sync frames. Furthermore, the encoder 2 feeds, to the NRZI converter 6, an output-code-word sequence corresponding to the input data in each of the later sync frames.

As shown in FIG. 6, the final control-bit-added input data have final DSV control bits in insertion points spaced at equal intervals of the prescribed number of successive bits. The DSV calculator 3 computes the first and second DSV values from the first and second CDS values and the first and second polarity signals notified by the encoder 2. The DSV calculator 3 informs the control-bit deciding section 4 of the computed first and second DSV values. For every sync frame, the control-bit deciding section 4 decides final DSV control bits for the respective DSV-control-bit insertion points in response to the first and second DSV values in a manner such as to decrease the absolute DSV values relating to the results of the NRZI modulation of the output-code-word sequence. An example of a history of the CDS value (the first or second CDS value), the polarity signal (the first or second polarity signal), and the DSV value (the first or second DSV value) is as follows. It is assumed that a first-moment DSV value is "0" and the bit polarity of an NRZI modulation result starts from the negative (−1). When a first-moment CDS value is "3", a second-moment DSV value is "−3" since the bit polarity starts from the negative. The first-moment CDS being "3" means the absence of polarity inversion, and hence causes a polarity signal of "1". When a second-moment CDS value is "3", a third-moment DSV value is "−6" since the corresponding bit polarity is equal to the negative. The second-moment CDS value being "3" means the absence of polarity inversion, and hence causes a polarity signal of "1". When a third-moment CDS value is "1", a fourth-moment DSV value is "−7" since the corresponding bit polarity is equal to the negative. The third-moment CDS value being "1" means the presence of polarity inversion, and hence causes a polarity signal of "0". Thus, the bit polarity changes from the negative to the positive (+1). When a fourth-moment CDS value is "3", a fifth-moment DSV value is "−4" since the corresponding bit polarity is equal to the positive.

The encoding of the final control-bit-added input data into the corresponding output-code-word sequence will be explained in more detail. It is assumed that the final control-bit-added input data have a bit pattern as "1101110011100". The left-hand edge of the input-data bit pattern is an MSB side while the right-hand edge thereof is an LSB side. It is also assumed that the current-table selection number Sk is "0" at an initial stage.

Initially, a higher eleven-bit portion "11011100111" of the above-indicated input-data bit pattern is fed from the shift register 2A to the encoding section 2B. Since the current-table selection number Sk is "0", the encoding section 2B accesses one of the encoding tables 2D which has an ID number of "0". The encoding section 2B finds that the input bit sequence "11011100111" matches with a registered input bit pattern Dk of "110111001xx" in the accessed encoding table (ID=0). Accordingly, the encoding section 2B reads, from the accessed encoding table (ID=0), an output code word Ck of "001" which is assigned to the registered input bit pattern "110111001xx", and a next-table selection number Sk+1 of "5" which accompanies the output code word "001". The next-table selection number Sk+1 being "5" will be used as a current-table selection number Sk of "5" in a next stage. The encoding section 2B feeds the output code word "001" to the NRZI converter 6.

Subsequently, the shift register 2A implements a 2-bit leftward shift so that the input bit sequence changes from "11011100111" to "01110011100". The input bit sequence "01110011100" is fed from the shift register 2A to the encoding section 2B. Since the current-table selection number Sk is "5", the encoding section 2B accesses one of the encoding tables 2D which has an ID number of "5". The encoding section 2B finds that the input bit sequence "01110011100" matches with a registered input bit pattern Dk of "01xxxxxxxxx" in the accessed encoding table (ID=5). Accordingly, the encoding section 2B reads, from the accessed encoding table (ID=5), an output code word Ck of "000" which is assigned to the registered input bit pattern "01xxxxxxxxx", and a next-table selection number Sk+1 of "5" which accompanies the output code word "000". The next-table selection number Sk+1 being "5" will be used as a current-table selection number Sk of "5" in a next stage. The encoding section 2B feeds the output code word "000" to the NRZI converter 6.

In this way, the bit sequence "1101" in the former part of the bit pattern "1101110011100" in the final control-bit-added input data is encoded into the output-code-word bit sequence "001000". The above-mentioned operation steps are iterated while the shift register 2A periodically implements a 2-bit shift.

With reference to FIGS. 7 and 8, the decision and generation of a final DSV control bit will be described in more detail. It is assumed that the first or second control-bit-added input data have a bit pattern as "11x111001110001111000" where "x" denotes a first or second candidate DSV control bit. The left-hand edge of the input-data bit pattern is an MSB side while the right-hand edge thereof is an LSB side. Since the first candidate DSV control bit "x" is "0", the bit pattern of the first control-bit-added input data is "110111001110001111000". Since the second candidate DSV control bit "x" is "1", the bit pattern of the second control-bit-added input data is "111111001110001111000". It is also assumed that the current-table selection number Sk and the first and second DSV values are "0" at an initial stage, and that the bit polarity of an NRZI modulation result starts from the positive (+1).

Regarding the first control-bit-added input data which have a first candidate DSV control bit "x" of "0", a higher eleven-bit portion "11011100111" of the above-indicated input-data bit pattern is initially fed from the shift register 2A to the encoding section 2B. Since the current-table selection number Sk is "0", the encoding section 2B accesses one of the encoding tables 2D which has an ID number of "0". The encoding section 2B finds that the input bit sequence "11011100111" matches with a registered input bit pattern Dk of "110111001xx" in the accessed encoding table (ID=0). Accordingly, the encoding section 2B reads, from the accessed encoding table (ID=0), an output code word Ck of "001" which is assigned to the registered input bit pattern "110111001xx", a first CDS value of "1" which relates to the output code word "001", and a next-table selection number Sk+1 of "5" which accompanies the output code word "001". The next-table selection number Sk+1 being "5" will be used as a current-table selection number Sk of "5" in a next stage. The encoding section 2B feeds the output code word "001" to the polarity deciding section 2C. The encoding section 2B notifies the DSV calculator 3 of the first CDS value "1". Since the number of bits of "1" in the output code word "001" is odd, the polarity deciding section 2C generates a new first polarity signal of "0" which denotes the presence of polarity inversion. The polarity deciding section 2C outputs the new first polarity signal "0" to the DSV calculator 3 for use in the next stage. The DSV calculator 3 computes a new first DSV value from the immediately-preceding first DSV value ("0"), the first CDS value, and the corresponding bit polarity. Since the first CDS value is "1" and the corresponding bit polarity is positive, the first DSV value computed by the DSV calculator 3 is updated from "0" to "1". The DSV calculator 3 notifies the control-bit deciding section 4 of the first DSV value "1".

Subsequently, the shift register 2A implements a 2-bit leftward shift so that the input bit sequence changes from "11011100111" to "01110011100". The input bit sequence "01110011100" is fed from the shift register 2A to the encoding section 2B. Since the current-table selection number Sk is "5", the encoding section 2B accesses one of the encoding tables 2D which has an ID number of "5". The encoding section 2B finds that the input bit sequence "01110011100" matches with a registered input bit pattern Dk of "01xxxxxxxxx" in the accessed encoding table (ID=5). Accordingly, the encoding section 2B reads, from the accessed encoding table (ID=5), an output code word Ck of "000" which is assigned to the registered input bit pattern "01xxxxxxxxx", a first CDS value of "3" which relates to the output code word "000", and a next-table selection number Sk+1 of "5" which accompanies the output code word "000". The next-table selection number Sk+1 being "5" will be used as a current-table selection number Sk of "5" in a next stage. The encoding section 2B feeds the output code word "000" to the polarity deciding section 2C. The encoding section 2B notifies the DSV calculator 3 of the first CDS value "3". Since the number of bits of "1" in the output code word "000" is even, the polarity deciding section 2C generates a new first polarity signal of "1" which denotes the absence of polarity inversion. The polarity deciding section 2C outputs the new first polarity signal "1" to the DSV calculator 3 for use in the next stage. The DSV calculator 3 computes a new first DSV value from the immediately-preceding first DSV value ("1"), the first CDS value, and the corresponding bit polarity. Since the current first polarity signal is "0" which denotes the presence of polarity inversion, the corresponding bit polarity is negative. Since the first CDS value is "3" and the corresponding bit polarity is negative, the first DSV value computed by the DSV calculator 3 is updated from "1" to "−2". The DSV calculator 3 notifies the control-bit deciding section 4 of the first DSV value "−2".

Thereafter, the shift register 2A implements a 2-bit leftward shift so that the input bit sequence changes from "01110011100" to "11001110001". The input bit sequence "11001110001" is fed from the shift register 2A to the encoding section 2B. Since the current-table selection number Sk is "5", the encoding section 2B accesses one of the encoding tables 2D which has an ID number of "5". The encoding section 2B finds that the input bit sequence "11001110001" matches with a registered input bit pattern Dk of "11xxxxxxxxx" in the accessed encoding table (ID=5). Accordingly, the encoding section 2B reads, from the accessed encoding table (ID=5), an output code word Ck of "000" which is assigned to the registered input bit pattern "11xxxxxxxxx", a first CDS value of "3" which relates to the output code word "000", and a next-table selection number Sk+1 of "0" which accompanies the output code word "000". The next-table selection number Sk+1 being "0" will be used as a current-table selection number Sk of "0" in a next stage. The encoding section 2B feeds the output code word "000" to the polarity deciding section 2C. The encoding section 2B notifies the DSV calculator 3 of the first CDS value "3". Since the number of bits of "1" in the output code word "000" is even, the polarity deciding section 2C generates a new first polarity signal of "1" which denotes the absence of polarity inversion. The polarity deciding section 2C outputs the new first polarity signal "1" to the DSV calculator 3 for use in the next stage. The DSV calculator 3 computes a new first DSV value from the immediately-preceding first DSV value ("−2"), the first CDS value, and the corresponding bit polarity. Since the current first polarity signal is "1" which denotes the absence of polarity inversion, the corresponding bit polarity is negative. Since the first CDS value is "3" and the corresponding bit polarity is negative, the first DSV value computed by the DSV calculator 3 is updated from "−2" to "−5". The DSV calculator 3 notifies the control-bit deciding section 4 of the first DSV value "−5".

Subsequently, the shift register 2A implements a 2-bit leftward shift so that the input bit sequence changes from "11001110001" to "00111000111". The input bit sequence "00111000111" is fed from the shift register 2A to the encoding section 2B. Since the current-table selection number Sk is "0", the encoding section 2B accesses one of the encoding tables 2D which has an ID number of "0". The encoding section 2B finds that the input bit sequence "00111000111" matches with a registered input bit pattern Dk of "001xxxxxxxx" in the accessed encoding table (ID=0). Accordingly, the encoding section 2B reads, from the accessed encoding table (ID=0), an output code word Ck of "010" which is assigned to the registered input bit pattern "001xxxxxxxx", a first CDS value of "−1" which relates to the output code word "010", and a next-table selection number Sk+1 of "2" which accompanies the output code word "010". The next-table selection number Sk+1 being "2" will be used as a current-table selection number Sk of "2" in a next stage. The encoding section 2B feeds the output code word "010" to the polarity deciding section 2C. The encoding section 2B notifies the DSV calculator 3 of the first CDS value "−1". Since the number of bits of "1" in the output code word "010" is odd, the polarity deciding section 2C generates a new first polarity signal of "0" which denotes the presence of polarity inversion. The polarity deciding section 2C outputs the new first polarity signal "0" to the DSV calculator 3 for use the next stage. The DSV calculator 3 computes a new first DSV value from the immediately-preceding first DSV value ("−5"), the first CDS value, and the corresponding bit polarity. Since the current polarity signal is "1" which denotes the absence of polarity inversion, the corresponding bit polarity is negative. Since the first CDS value is "−1" and the corresponding bit polarity is negative, the first DSV value computed by the DSV calculator 3 is updated from "−5" to "−4". The DSV calculator 3 notifies the control-bit deciding section 4 of the first DSV value "−4".

Thereafter, the shift register 2A implements a 2-bit leftward shift so that the input bit sequence changes from "00111000111" to "11100011110". The input bit sequence "11100011110" is fed from the shift register 2A to the encoding section 2B. Since the current-table selection number Sk is "2", the encoding section 2B accesses one of the encoding tables 2D which has an ID number of "2". The encoding section 2B finds that the input bit sequence "11100011110" matches with a registered input bit pattern Dk of "11xxxxxxxxx" in the accessed encoding table (ID=2). Accordingly, the encoding section 2B reads, from the accessed encoding table (ID=2), an output code word Ck of "100" which is assigned to the registered input bit pattern "11xxxxxxxxx", a first CDS value of "−3" which relates to the output code word "100", and a next-table selection number Sk+1 of "0" which accompanies the output code word "100". The next-table selection number Sk+1 being "0" will be used as a current-table selection number Sk of "0" in a next stage. The encoding section 2B feeds the output code word "100" to the polarity deciding section 2C. The encoding section 2B notifies the DSV calculator 3 of the first CDS value "−3". Since the number of bits of "1" in the output code word "100" is odd, the polarity deciding section 2C generates a new first polarity signal of "0" which denotes the presence of polarity inversion. The polarity deciding section 2C outputs the new first polarity signal "0" to the DSV calculator 3 for use in the next stage. The DSV calculator 3 computes a new first DSV value from the immediately-preceding first DSV value ("−4"), the first CDS value, and the corresponding bit polarity. Since the current first polarity signal is "0" which denotes the presence of polarity inversion, the corresponding bit polarity is positive. Since the first CDS value is "−3" and the corresponding bit polarity is positive, the first DSV value computed by the DSV calculator 3 is updated from "−4" to "−7". The DSV calculator 3 notifies the control-bit deciding section 4 of the first DSV value "−7".

Subsequently, the shift register 2A implements a 2-bit leftward shift so that the input bit sequence changes from "11100011110" to "10001111000". The input bit sequence "10001111000" is fed from the shift register 2A to the encoding section 2B. Since the current-table selection number Sk is "0", the encoding section 2B accesses one of the encoding tables 2D which has an ID number of "0". The encoding section 2B finds that the input bit sequence "10001111000" matches with a registered input bit pattern Dk of "10xxxxxxxxx" in the accessed encoding table (ID=0). Accordingly, the encoding section 2B reads, from the accessed encoding table (ID=0), an output code word Ck of "001" which is assigned to the registered input bit pattern "10xxxxxxxxx", a first CDS value of "1" which relates to the output code word "001", and a next-table selection number Sk+1 of "1" which accompanies the output code word "001". The next-table selection number Sk+1 being "1" will be used as a current-table selection number Sk of "1" in a next stage. The encoding section 2B feeds the output code word "001" to the polarity deciding section 2C. The encoding section 2B notifies the DSV calculator 3 of the first CDS value "1". Since the number of bits of "1" in the output code word "001" is odd, the polarity deciding section 2C generates a new first polarity signal of "0" which denotes the presence of polarity inversion. The polarity deciding section 2C outputs the new first polarity signal "0" to the DSV calculator 3 for use in the next stage. The DSV calculator 3 computes a new first DSV value from the immediately-preceding first DSV value ("−7"), the first CDS value, and the corresponding bit polarity. Since the current first polarity signal is "0" which denotes the presence of polarity inversion, the corresponding bit polarity is negative. Since the first CDS value is "1" and the corresponding bit polarity is negative, the first DSV value computed by the DSV calculator 3 is updated from "−7" to "−8". The DSV calculator 3 notifies the control-bit deciding section 4 of the first DSV value "−8".

Thus, regarding the first control-bit-added input data "11x111001110001111000" which have a first candidate DSV control bit "x" of "0", the first DSV value changes as "1", "−2", "−5", "−4", "−7", and "−8".

On the other hand, regarding the second control-bit-added input data which have a second candidate DSV control bit "x" of "1", a higher eleven-bit portion "11111100111" of the previously-indicated input-data bit pattern is initially fed from the shift register 2A to the encoding section 2B. Since the current-table selection number Sk is "0", the encoding section 2B accesses one of the encoding tables 2D which has an ID number of "0". The encoding section 2B finds that the input bit sequence "11111100111" matches with a registered input bit pattern Dk of "11xxxxxxxxx" in the accessed encoding table (ID=0). Accordingly, the encoding section 2B reads, from the accessed encoding table (ID=0), an output code word Ck of "101" which is assigned to the registered input bit pattern "11xxxxxxxxx", a second CDS value of "−1" which relates to the output code word "101", and a next-table selection number Sk+1 of "1" which accompanies the output code word "101". The next-table selection number Sk+1 being "1" will be used as a current-table selection number Sk of "1" in a next stage. The encoding section 2B feeds the output code word "101" to the. polarity deciding section 2C. The encoding section 2B notifies the DSV calculator 3 of the second CDS value "−1". Since the number of bits of "1" in the output code word "101" is even, the polarity deciding section 2C generates a new second polarity signal of "1" which denotes the absence of polarity inversion. The polarity deciding section 2C outputs the new second polarity signal "1" to the DSV calculator 3 for use in the next stage. The DSV calculator 3 computes a new second DSV value from the immediately-preceding second DSV value ("0"), the second CDS value, and the corresponding bit polarity. Since the second CDS value is "−1" and the corresponding bit polarity is positive, the second DSV value computed by the DSV calculator 3 is updated from "0" to "−1". The DSV calculator 3 notifies the control-bit deciding section 4 of the second DSV value "−1".

Subsequently, the shift register 2A implements a 2-bit leftward shift so that the input bit sequence changes from "11111100111" to "11110011100". The input bit sequence "11110011100" is fed from the shift register 2A to the encoding section 2B. Since the current-table selection number Sk is "1", the encoding section 2B accesses one of the encoding tables 2D which has an ID number of "1". The encoding section 2B finds that the input bit sequence "11110011100" matches with a registered input bit pattern Dk of "11xxxxxxxxx " in the accessed encoding table (ID=1). Accordingly, the encoding section 2B reads, from the accessed encoding table (ID=1), an output code word Ck of "000" which is assigned to the registered input bit pattern "11xxxxxxxxx", a second CDS value of "3" which relates to the output code word "000", and a next-table selection number Sk+1 of "0" which accompanies the output code word "000". The next-table selection number Sk+1 being "0" will be used as a current-table selection number Sk of "0" in a next stage. The encoding section 2B feeds the output code word "000" to the polarity deciding section 2C. The encoding section 2B notifies the DSV calculator 3 of the second CDS value "3". Since the number of bits of "1" in the output code word "000" is even, the polarity deciding section 2C generates a new second polarity signal of "1" which denotes the absence of polarity inversion. The polarity deciding section 2C outputs the new second polarity signal "1" to the DSV calculator 3 for use in the next stage. The DSV calculator 3 computes a new second DSV value from the immediately-preceding second DSV value ("−1"), the second CDS value, and the corresponding bit polarity. Since the current second polarity signal is "1" which denotes the absence of polarity inversion, the corresponding bit polarity is positive. Since the second CDS value is "3" and the corresponding bit polarity is positive, the second DSV value computed by the DSV calculator 3 is updated from "−1" to "2". The DSV calculator 3 notifies the control-bit deciding section 4 of the second DSV value "2".

Thereafter, the shift register 2A implements a 2-bit leftward shift so that the input bit sequence changes from "11110011100" to "11001110001". The input bit sequence "11001110001" is fed from the shift register 2A to the encoding section 2B. Since the current-table selection number Sk is "0", the encoding section 2B accesses one of the encoding tables 2D which has an ID number of "0". The encoding section 2B finds that the input bit sequence "11001110001" matches with a registered input bit pattern Dk of "11xxxxxxxxx" in the accessed encoding table (ID=0). Accordingly, the encoding section 2B reads, from the accessed encoding table (ID=0), an output code word Ck of "101" which is assigned to the registered input bit pattern "11xxxxxxxxx" a second CDS value of "−1" which relates to the output code word "101", and a next-table selection number Sk+1 of "1" which accompanies the output code word "101". The next-table selection number Sk+1 being "1" will be used as a current-table selection number Sk of "1" in a next stage. The encoding section 2B feeds the output code word "101" to the polarity deciding section 2C. The encoding section 2B notifies the DSV calculator 3 of the second CDS value "−1". Since the number of bits of "1" in the output code word "101" is even, the polarity deciding section 2C generates a new second polarity signal of "1" which denotes the absence of polarity inversion. The polarity deciding section 2C outputs the new second polarity signal "1" to the DSV calculator 3 for use in the next stage. The DSV calculator 3 computes a new second DSV value from the immediately-preceding second DSV value ("2"), the second CDS value, and the corresponding bit polarity. Since the current second polarity signal is "1" which denotes the absence of polarity inversion, the corresponding bit polarity is positive. Since the second CDS value is "−1" and the corresponding bit polarity is positive, the second DSV value computed by the DSV calculator 3 is updated from "2" to "1". The DSV calculator 3 notifies the control-bit deciding section 4 of the second DSV value "1".

Subsequently, the shift register 2A implements a 2-bit leftward shift so that the input bit sequence changes from "11001110001" to "00111000111". The input bit sequence "00111000111" is fed from the shift register 2A to the encoding section 2B. Since the current-table selection number Sk is "1", the encoding section 2B accesses one of the encoding tables 2D which has an ID number of "1". The encoding section 2B finds that the input bit sequence "00111000111" matches with a registered input bit pattern Dk of "001xxxxxxxx" in the accessed encoding table (ID=1). Accordingly, the encoding section 2B reads, from the accessed encoding table (ID=1), an output code word Ck of "010" which is assigned to the registered input bit pattern "001xxxxxxxx", a second CDS value of "−1" which relates to the output code word "010", and a next-table selection number Sk+1 of "2" which accompanies the output code word "010". The next-table selection number Sk+1 being "2" will be used as a current-table selection number Sk of "2" in a next stage. The encoding section 2B feeds the output code word "010" to the polarity deciding section 2C. The encoding section 2B notifies the DSV calculator 3 of the second CDS value "−1". Since the number of bits of "1" in the output code word "010" is odd, the polarity deciding section 2C generates a new second polarity signal of "0" which denotes the presence of polarity inversion. The polarity deciding section 2C outputs the new second polarity signal "0" to the DSV calculator 3 for use in the next stage. The DSV calculator 3 computes a second DSV value from the immediately-preceding second DSV value ("1"), the second CDS value, and the corresponding bit polarity. Since the current second polarity signal is "1" which denotes the absence of polarity inversion, the corresponding bit polarity is positive. Since the second CDS value is "−1" and the corresponding bit polarity is positive, the second DSV value computed by the DSV calculator 3 is updated from "1" to "0". The DSV calculator 3 notifies the control-bit deciding section 4 of the second DSV value "0".

Thereafter, the shift register 2A implements a 2-bit leftward shift so that the input bit sequence changes from "00111000111" to "11100011110". The input bit sequence "11100011110" is fed from the shift register 2A to the encoding section 2B. Since the current-table selection number Sk is "2", the encoding section 2B accesses one of the encoding tables 2D which has an ID number of "2". The encoding section 2B finds that the input bit sequence "11100011110" matches with a registered input bit pattern Dk of "11xxxxxxxxx" in the accessed encoding table (ID=2). Accordingly, the encoding section 2B reads, from the accessed encoding table (ID=2), an output code word Ck of "100" which is assigned to the registered input bit pattern "11xxxxxxxxx", a second CDS value of "−3" which relates to the output code word "100", and a next-table selection number Sk+1 of "0" which accompanies the output code word "100". The next-table selection number Sk+1 being "0" will be used as a current-table selection number Sk of "0" in a next stage. The encoding section 2B feeds the output code word "100" to the polarity deciding section 2C. The encoding section 2B notifies the DSV calculator 3 of the second CDS value "−3". Since the number of bits of "1" in the output code word "100" is odd, the polarity deciding section 2C generates a new second polarity signal of "0" which denotes the presence of polarity inversion. The polarity deciding section 2C outputs the new second polarity signal "0" to the DSV calculator 3 for use in the next stage. The DSV calculator 3 computes a second DSV value from the immediately-preceding second DSV value ("0"), the second CDS value, and the corresponding bit polarity. Since the current second polarity signal is "0" which denotes the presence of polarity inversion, the corresponding bit polarity is negative. Since the second CDS value is "−3" and the corresponding bit polarity is negative, the second DSV value computed by the DSV calculator 3 is updated from "0" to "3". The DSV calculator 3 notifies the control-bit deciding section 4 of the second DSV value "3".

Subsequently, the shift register 2A implements a 2-bit leftward shift so that the input bit sequence changes from "11100011110" to "10001111000". The input bit sequence "10001111000" is fed from the shift register 2A to the encoding section 2B. Since the current-table selection number Sk is "0", the encoding section 2B accesses one of the encoding tables 2D which has an ID number of "0". The encoding section 2B finds that the input bit sequence "10001111000" matches with a registered input bit pattern Dk of "10xxxxxxxxx" in the accessed encoding table (ID=0). Accordingly, the encoding section 2B reads, from the accessed encoding table (ID=0), an output code word Ck of "001" which is assigned to the registered input bit pattern "10xxxxxxxxx", a second CDS value of "1" which relates to the output code word "001", and a next-table selection number Sk+1 of "1" which accompanies the output code word "001". The next-table selection number Sk+1 being "1" will be used as a current-table selection number Sk of "1" in a next stage. The encoding section 2B feeds the output code word "001" to the polarity deciding section 2C. The encoding section 2B notifies the DSV calculator 3 of the second CDS value "1". Since the number of bits of "1" in the output code word "001" is odd, the polarity deciding section 2C generates a new second polarity signal of "0" which denotes the presence of polarity inversion. The polarity deciding section 2C outputs the new second polarity signal "0" to the DSV calculator 3 for use in the next stage. The DSV calculator 3 computes a second DSV value from the immediately-preceding second DSV value ("3"), the second CDS value, and the corresponding bit polarity. Since the current second polarity signal is "0" which denotes the presence of polarity inversion, the corresponding bit polarity signal is positive. Since the second CDS value is "1" and the corresponding bit polarity is positive, the second DSV value computed by the DSV calculator 3 is updated from "3" to "4". The DSV calculator 3 notifies the control-bit deciding section 4 of the second DSV value "4".

Thus, regarding the second control-bit-added input data "11x111001110001111000" which have a second candidate DSV control bit "x" of "1", the second DSV value changes as "−1", "2", "1", "0", "3", and "4".

As previously mentioned, the control-bit deciding section 4 senses ones among the first DSV values which correspond to the DSV-control-bit insertion points in the first control-bit-added input data respectively. The first DSV values relate to the first candidate DSV control bits. Also, the control-bit deciding section 4 senses ones among the second DSV values which correspond to the DSV-control-bit insertion points in the second control-bit-added input data respectively. The second DSV values relate to the second candidate DSV control bits. For every DSV-control-bit insertion point, the control-bit deciding section 4 compares the first and second corresponding DSV values with each other to decide which of the two is smaller in absolute value. The control-bit deciding section 4 selects one from the first and second candidate DSV control bits which corresponds to the smaller-absolute DSV value. The control-bit deciding section 4 decides that a final DSV control bit for the DSV-control-bit insertion point immediately preceding the present DSV-control-bit insertion point is equal to the selected one. Preferably, the control-bit deciding section 4 accesses the DSV memories in the DSV calculator 3 and updates the DSV value with the larger absolute value to the DSV value with the smaller absolute value therein. These operation steps are iterated so that the control-bit deciding section 4 sequentially decides and generates a plurality of final DSV control bits.

Second Embodiment

Figure 9:
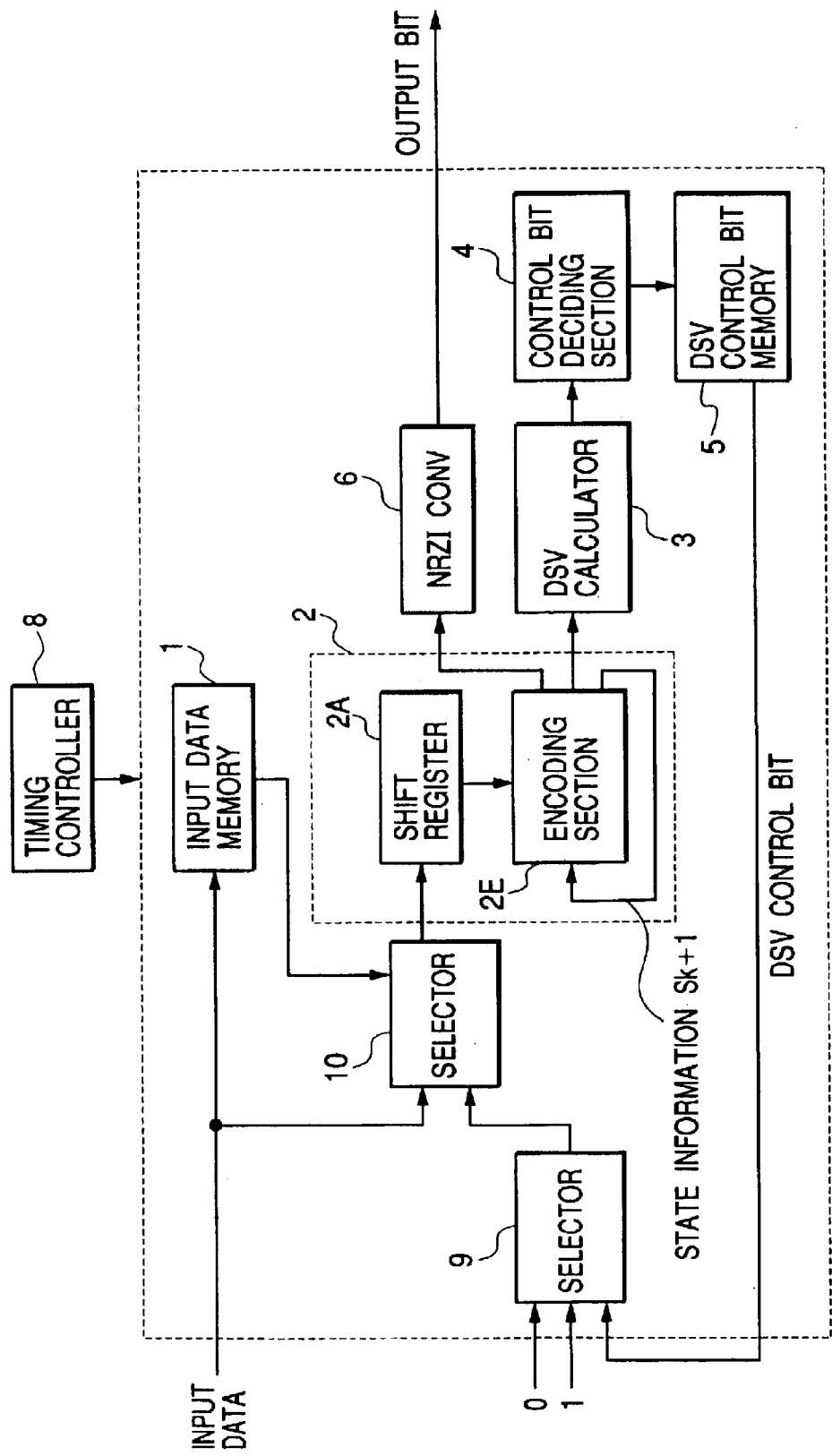
FIG. 9 is a block diagram of an encoding apparatus according to a second embodiment of this invention.

FIG. 9 shows an encoding apparatus according to a second embodiment of this invention. The encoding apparatus of FIG. 9 is similar to that of FIGS. 1 and 2 except for design changes mentioned hereafter. The encoding apparatus of FIG. 9 includes a memory 1, an encoder 2, a DSV calculator 3, a control-bit deciding section 4, a memory 5, and an NRZI converter 6 similar to those in FIGS. 1 and 2. The encoder 2 includes a shift register 2A similar to that in FIG. 2. The encoder 2 also includes an encoding section 2E similar to the combination of the encoding section 2B and the polarity deciding section 2C in FIG. 2. Thus, the encoding section 2E has encoding tables similar to those in FIGS. 1 and 2.

The encoding apparatus of FIG. 9 contains a timing controller 8, and selectors 9 and 10. The selector 9 is connected with the memory 5 and the selector 10. The selector 10 is connected with the memory 1 and the shift register 2A. The timing controller 8 feeds an operation timing signal (for example, a suitable clock signal or a bit clock signal) to the devices 1, 2, 3, 4, 5, 6, 9, and 10 to control the timing of operation of the encoding apparatus.

Input data in a first sync frame are fed to the selector 10 while being stored into the memory 1. The selector 9 receives a signal of "0" and a signal of "1" from suitable signal sources (not shown). The device 9 selects the signal of "0", and passes the selected signal to the selector 10. The selector 10 periodically inserts the signal of "0" into the input data in the first sync frame as a first candidate DSV control bit to get first control-bit-added input data. The selector 10 outputs the first control-bit-added input data to the shift register 2A in the encoder 2. The shift register 2A stores the first control-bit-added input data. While the shirt register 2A periodically shifts the stored first control-bit-added input data on a 2-bit by 2-bit basis, the encoder 2 generates a first polarity signal and a first CDS value from every 2 bits of the first control-bit-added input data according to the encoding tables. The encoder 2 outputs the first polarity signal and the first DSV value to the DSV calculator 3. The DSV calculator 3 periodically computes a first DSV value from the first polarity signal and the first CDS value. The first DSV value corresponds to the first control-bit-added input data or the first candidate DSV control bit being "0". The DSV calculator 3 includes a DSV memory for storing a signal representative of the first DSV value. The DSV calculator 3 notifies the control-bit deciding section 4 of the first DSV value.

The input data in the first sync frame are transferred from the memory 1 to the selector 10. The device 9 selects the signal of "1", and passes the selected signal to the selector 10. The selector 10 periodically inserts the signal of "1" into the input data in the first sync frame as a second candidate DSV control bit to get second control-bit-added input data. The selector 10 outputs the second control-bit-added input data to the shift register 2A in the encoder 2. The shift register 2A stores the second control-bit-added input data. While the shift register 2A periodically shifts the stored second control-bit-added input data on a 2-bit by 2-bit basis, the encoder 2 generates a second polarity signal and a second CDS value from every 2 bits of the second control-bit-added input data according to the encoding tables. The encoder outputs the second polarity signal and the second CDS value to the DSV calculator 3. The DSV calculator 3 periodically computes a second DSV value from the second polarity signal and the second CDS value. The second DSV value corresponds to the second control-bit-added input data or the second candidate DSV control bit being "1". The DSV calculator 3 includes a DSV memory for storing a signal representative of the second DSV value. The DSV calculator 3 notifies the control-bit deciding section 4 of the second DSV value.

The control-bit deciding section 4 senses ones among the first DSV values which correspond to the DSV-control-bit insertion points in the first control-bit-added input data respectively. Also, the control-bit deciding section 4 senses ones among the second DSV values which correspond to the DSV-control-bit insertion points in the second control-bit-added input data respectively. For every DSV-control-bit insertion point, the control-bit deciding section 4 compares the first and second corresponding DSV values with each other to decide which of the two is smaller in absolute value. The control-bit deciding section 4 selects one from the first and second candidate DSV control bits which corresponds to the smaller-absolute DSV value. The control-bit-deciding section 4 decides that a final DSV control bit for the DSV-control-bit insertion point immediately preceding the present DSV-control-bit insertion point is equal to the selected one. Preferably, the control-bit deciding section 4 accesses the DSV memories in the DSV calculator 3 and updates the DSV value with the larger absolute value to the DSV value with the smaller absolute value therein. These operation steps are iterated so that the control-bit deciding section 4 sequentially decides and generates a plurality of final DSV control bits for the input data in the first sync frame. The control-bit deciding section 4 stores the final DSV control bits into the memory 5.

Thereafter, the input data in the first sync frame are transferred from the memory 1 to the selector 10. The final DSV control bits for the input data in the first sync frame are sequentially transferred from the memory 5 to the selector 10 via the selector 9. The selector 10 inserts the final DSV control bits into the input data to get final control-bit-added input data. The selector 10 outputs the final control-bit-added input data to the shift register 2A in the encoder 2. The shift register 2A stores the final control-bit-added input data. While the shift register 2A periodically shift the stored final control-bit-added input data, the encoder 2 converts every 2 bits of the final control-bit-added input data into a corresponding portion of an output-code-word sequence according to the encoding tables. The encoder 2 feeds the output-code-word sequence to the NRZI converter 6.

Similarly, input data in each of second and later sync frames are processed and encoded into a corresponding output-code-word sequence fed to the NRZI converter 6.

Third Embodiment

A third embodiment of this invention is similar to the first or second embodiment thereof except for design changes mentioned hereafter.

In the third embodiment of this invention, an input bit stream is encoded into a stream of output code words according to variable-length encoding rules using a variable constraint length. A maximum value N of the constraint length is equal to or greater than 2. The output-code-word stream observes prescribed run length limiting rules RLL(d, k), where "d" and "k" denote a predetermined minimum run length and a predetermined maximum run length respectively.

Every m-bit piece of the input bit stream is encoded into an n-bit output code word by referring to predetermined M encoding tables following the variable-length encoding rules, where "m" and "n" denote predetermined natural numbers respectively and M denotes a predetermined natural number equal to or greater than 2.

For example, an 11-bit portion of the input bit stream is shifted on a 2-bit by 2-bit basis relative to the whole of the input bit stream. Two higher bits of every 11-bit portion is encoded into a 3-bit output code word.

CDS (code word digital sum) values are generated which correspond to respective n-bit output code words generated by the previously-mentioned encoding procedure. DSV (digital sum variation) control bits are generated in response to the generated CDS values. The generated DSV control bits are inserted into the input bit stream at intervals each corresponding to a prescribed number of successive bits.

The input bit stream is subjected to variable-length encoding while DSV control is implemented in response to the inserted DSV control bits.

Preferably, DSV values equal to accumulations of the CDS values are calculated. In this case, the DSV control bits are decided in response to the calculated DSV values. The input bit stream is subjected to the variable-length encoding which uses the M encoding tables.

Preferably, the numbers "d" and "k" are equal to 1 and 7 respectively.

A recording medium may be provided. The recording medium stores the output-code-word stream generated from the input bit stream in the previously-mentioned way.

A transmission medium may be provided. The transmission medium is designed for transmission of the output-code-word stream generated from the input bit stream in the previously-mentioned way.

A computer program may be provided. The computer program is designed to enable a computer to implement the previously-mentioned encoding procedure.

Advantages Provided by the Invention

The encoding tables are designed so that first and second CDS values can be outputted in response to the two higher bits of every 11-bit portion of first control-bit-added input data and the two higher bits of every 11-bit portion of second control-bit-added input data. According to a simple algorithm, DSV control can be implemented in response to the first and second CDS values. It is possible to properly handle variable-length-code input signals of different constraint lengths without subjecting them to complicated processing.

What is claimed is:

1. An apparatus for encoding an input bit stream into a stream of output code words according to variable-length encoding rules using a variable constraint length, wherein a maximum value N of the constraint length is equal to or greater than 2, and the output-code-word stream observes prescribed run length limiting rules RLL(d, k), "d" and "K" denoting a predetermined minimum run length and a predetermined maximum run length respectively, the apparatus comprising:

first means for periodically inserting a first candidate DSV (digital sum variation) control bit being "0" into an original input bit stream to get first control-bit-added input data;

second means for periodically inserting a second candidate DSV control bit being "1" into the original input bit stream to get second control-bit-added input data;

third means for encoding every m-bit piece of the first control-bit-added input data into a first n-bit output signal by referring to a plurality of encoding tables following the variable-length encoding rules, "m" and "n" denoting predetermined natural numbers respectively;

fourth means for encoding every m-bit piece of the second control-bit-added input data into a second n-bit output signal by referring to the encoding tables;

fifth means for generating first CDS (code word digital sum) values corresponding to respective first n-bit output signals generated by the third means;

sixth means for generating second CDS values corresponding to respective second n-bit output signals generated by the fourth means;

seventh means for periodically generating a first DSV value in response to the first CDS values generated by the fifth means, the first DSV value corresponding to the first candidate DSV control bit;

eighth means for periodically generating a second DSV value in response to the second CDS values generated by the sixth means, the second DSV value corresponding to the second candidate DSV control bit;

ninth means for comparing the first and second DSV values generated by the seventh and eighth means with each other, and deciding which of the first and second DSV values is smaller in absolute value to get a smaller-absolute DSV value;

tenth means for selecting one from the first and second candidate DSV control bits as a final DSV control bit which corresponds to the smaller-absolute DSV value;

eleventh means for inserting the final DSV control bit into the original input bit stream to get final control-bit-added input data; and twelfth means for encoding every m-bit piece of the final control-bit-added input data into a final n-bit output signal by referring to the encoding tables; and thirteenth means for serially connecting final n-bit output signals generated by the twelfth means to get a stream of output code words.

2. An apparatus as recited in claim 1, wherein the numbers "d" and "k" are equal to 1 and 7, respectively.

3. A recording medium storing an output-code-word stream generated from an input bit stream by the apparatus of claim 1.

4. A transmission medium for transmission of an output-code-word stream generated from an input bit stream by the apparatus of claim 1.

* * * * *